United States Patent [19]
Ogura

[11] Patent Number: 6,074,928
[45] Date of Patent: Jun. 13, 2000

[54] METHOD OF FABRICATING SOI SUBSTRATE

[75] Inventor: Atsushi Ogura, Tokyo, Japan

[73] Assignee: NEC Corporation, Tokyo, Japan

[21] Appl. No.: 09/023,132

[22] Filed: Feb. 12, 1998

[30] Foreign Application Priority Data

Feb. 12, 1997 [JP] Japan .................................. 9-027894

[51] Int. Cl.⁷ .................................................. H01L 21/76
[52] U.S. Cl. ........................................................ 438/404
[58] Field of Search .................................... 438/404, 149, 438/196, 197, 154, 155, 203, 207, 455, 959; 148/DIG. 9

[56] References Cited

U.S. PATENT DOCUMENTS 5,258,318  11/1993  Buti et al. .............................. 438/154

FOREIGN PATENT DOCUMENTS

| 63-142655 | 6/1988 | Japan . |
| 1-128574 | 5/1989 | Japan . |
| 7-201773 | 8/1995 | Japan . |
| 7-263538 | 10/1995 | Japan . |
| 8-102448 | 4/1996 | Japan . |

OTHER PUBLICATIONS

Nakashima, Sadao et al., "Analysis of buried oxide layer formation and mechanism of threading dislocation generation in the substoichiometric oxygen dose region", *J. Mater. Res.*, vol. 8, No. 3, Mar. 1993, pp. 523–534.

*Primary Examiner*—Charles Bowers
*Assistant Examiner*—Craig Thompson
*Attorney, Agent, or Firm*—Hutchins, Wheeler & Dittmar

[57] ABSTRACT

An oxygen ion is implanted into a silicon substrate at a dose of $3 \times 10^{17}$ ($cm^{-2}$) or lower. Then, the silicon substrate is heated at 1250° C. or lower for 40 minute or longer. And the silicon substrate is heated at 1300° C. or higher in an inert gas atmosphere. Further, the silicon substrate is heated at 1300° C. or higher in an atmosphere containing an oxygen gas in an amount of 1% by volume or more.

14 Claims, 3 Drawing Sheets

METHOD OF FABRICATING SOI SUBSTRATE

BACKGROUND OF THE INVENTION

1. Field of the Invention

The present invention related to a method of fabricating an SOI (Silicon On Insulator) substrate having a semiconductor layer on an insulation film, which is suitable for a substrate of LSI in next generation, and particularly, a method of fabricating an SOI substrate which is contrived to inhibit a crystal defect in a semiconductor layer.

2. Description of the Related Art

As one method of fabricating an SOI substrate having a semiconductor active layer on an insulation film, there is, for example, a SIMOX (Separation by Implanted Oxygen) method disclosed in Journal of Material Research, Vol. 8, No. 3, pp. 523 to 534, 1993. In the SIMOX method, oxygen ion ($O^+$) in a high dose, for example, $0.3 \times 10^{18}$ to $2.0 \times 10^{18}$ ($cm^{-2}$), is first implanted into a Si substrate, then, the Si substrate is annealed at high temperature to form a continuous oxide film ($SiO_2$ film) inside the substrate.

In this method, there is a problem that a crystal defect remains in a Si active layer on the continuous oxide film which is an area on which devices are to be formed, though the SOI substrate can be relatively easily provided. The density of the crystal defects remaining in the Si active layer depends on dose of the implanted oxygen ion, and in the case of high dose, more crystal defects remain as compared with the lower dose case. Therefore, there is suggested a method in which the dose of an implanted oxygen ion is lowered for reducing the crystal defects. However, for example, when an oxygen ion is implanted at low dose, for example, from $3 \times 10^{17}$ to $4 \times 10^{17}$ ($cm^{-2}$), a continuous oxide film is not formed in the following thermal treatment at high temperature, forming a route for a leak current, and excellent device property can not be obtained.

Therefore, there is suggested a method of fabricating an SOI substrate by determining thermal treatment conditions after implantation of an oxygen ion (Japanese Unexamined Patent Publication (Kokai) Nos. Hei 7-201773, 7263538). In the conventional method of fabricating an SOI substrate described in Japanese Unexamined Patent Publication (Kokai) No. Hei 7-201773, a field oxide film for element separation is first formed on a semiconductor substrate, and an oxygen ion is implanted in an area surrounded by the field oxide film. Then, the semiconductor substrate is annealed at 1250° C. or higher in an inert gas atmosphere or the like. By this method, a buried oxide film is formed so as to be continuous with the field oxide film. In this conventional method, the field oxide film promotes the formation of the buried oxide film, and at the same time, a crystal defect caused by the formation of the field oxide film is removed in the following thermal treatment.

On the other hand, in the conventional method of fabricating an SOI substrate described in Japanese Unexamined Patent Publication (Kokai) No. Hei 7-263538, an oxygen ion is implanted into a substrate, then the substrate is annealed, and thereafter, the substrate is again annealed in an oxygen gas atmosphere. FIGS. 1A to 1D are cross-sectional views showing the method of fabricating an SOI substrate described in Japanese Unexamined Patent Publication (Kokai) No. Hei 7-263538, in the process order. In the conventional art, as shown in FIG. 1A, an oxygen ion is first implanted into a single crystal silicon substrate 21, to form an ion-implanted layer 22 in the single crystal silicon substrate 21. Then, as shown in FIG. 1B, an anneal protecting film 23 composed of $SiO_2$ is formed on the surface of the single crystal silicon substrate 21, using a CVD apparatus. Next, as shown in FIG. 1C, the single crystal silicon substrate 21 is annealed in an inert gas atmosphere, to convert the ion-implanted layer 22 in the single crystal silicon substrate 21 to a first buried oxide film 24. In this process, an oxide film 25 is formed on the surface of the silicon substrate 21. In this point, the thickness of the first buried oxide film 24 is small, pinholes may sometimes be formed in the first buried oxide film 24, and relatively large unevenness may sometimes be formed on the interface between the first buried oxide film 24 and the Si active layer 21a.

Then, the single crystal silicon substrate 21 is annealed at a temperature from 1150 to 1415° C. in atmosphere wherein the oxygen gas concentration is from 1% by volume to 100% by volume. By this treatment, as shown in FIG. 1D, a second buried oxide film 26 is formed, wherein the film thickness is large, and pinhole and unevenness on the interface are reduced. Then, an oxide film 27 thicker than the oxide film 24 is formed on the surface of the silicon substrate 21.

Further, there is also disclosed a method in which the thickness of a Si active layer can be reduced, by annealing the silicon substrate 21 as sacrifice oxidation at 1100° C. or lower, then, removing the sacrifice oxide film thus formed.

However, even by these conventional fabricating methods described in these publications, it is difficult to form a sufficient buried oxide film with inhibiting formation of crystal defects.

Further, a method of fabricating an SOI substrate by adopting a laser recrystallization method is suggested (Japanese Unexamined Patent Publication (Kokai) No. Hei 1-128574). In a conventional method of fabricating an SOI substrate described in this publication, an insulation film is first formed, having opening portions in planned regions for forming devices such as source/drain regions and the like excepting a channel region on a single crystal silicon substrate. Then, a polycrystal silicon layer is buried in these opening portions before another polycrystal silicon layer is laminated on the whole surface. Subsequently, the laminated polycrystal silicon layer is converted to a single crystal by a laser recrystallization method using the single crystal silicon substrate as a seed crystal. Then, an oxygen ion is implanted into the single crystal silicon layer formed in the opening portions and the silicon substrate is annealed, to form a substrate having SOI structure.

By this conventional technique, a crystal defect can not satisfactorily be inhibited though high integration of a semiconductor apparatus can be accomplished.

SUMMARY OF THE INVENTION

The object of the present invention is to provide a method of fabricating an SOI substrate, which can form a continuous oxide film and can reduce crystal defects in an active layer.

The method of fabricating an SOI substrate of the present invention comprises the steps of: implanting an oxygen ion into a silicon substrate at a dose of $3 \times 10^{17}$ ($cm^{-2}$) or lower, heating the silicon substrate at 1250° C. or lower for 40 minute or longer, and heating the silicon substrate at 1300° C. or higher.

The present inventor has intensively studied for solving the above-described object, and consequently, the following facts regarding the conventional methods of fabricating an SOI substrate have been found.

When acceleration energy upon implanting an oxygen ion is 180 kev, if the dose of an oxygen ion is about $1.2 \times 10^{18}$ ($cm^{-2}$) or higher, a continuous buried oxide film is already formed directly after ion implantation, oxygen ions in surrounding areas concentrate by the subsequent thermal treatment at high temperature to complete an SOI substrate.

On the other hand, if the dose of an oxygen ion is lower than about $1.2 \times 10^{18}$ ($cm^{-2}$), minute oxides are deposited directly after the ion implantation and scattered like islands, and by the subsequent thermal treatment, some oxide islands grow, and join together to form a large island. There are also islands that disappear by thermal treatment. For formation of a continuous oxide film, it is necessary that the density and distribution of oxide islands directly after the ion implantation are suitable. And, for inhibition of formation of crystal defect in a silicon layer, if the dose is $3 \times 10^{17}$ ($cm^{-2}$) or lower, for example, a continuous oxide film is not formed, generating a cause of a leak current, and an excellent SOI substrate can not be manufactured.

The present inventor has further studied in detail, and consequently found that by previously heating a silicon substrate at a low temperature of 1250° C. or lower for 40 minutes or longer before heating the silicon substrate at high temperature of 1300° C. or higher, nuclei of minute oxide islands can be deposited at high density, and by heating the silicon substrate at high temperature, a continuous oxide film is formed. The reason for that is that at a low temperature of 1250° C. or lower, even a nucleus of a minutes oxide island can exist in thermodynamically stable manner, and by keeping this temperature for 40 minutes or longer, the oxide island grows to a size which can exist in stable manner even at a high temperature of 1300° C. or higher.

Therefore, according to the present invention, even at a dose of $3 \times 10^{17}$ ($cm^{-2}$) or lower, formation of a continuous oxide film becomes possible which has been conventionally impossible, and an excellent SOI substrate can be obtained by a SIMOX method.

Further, since it is possible to reduce the dose as compared with the conventional method, time required for the ion implantation can be shortened. Therefore, reduction effect of process cost can also be obtained simultaneously.

DETAILED DESCRIPTION OF THE PREFERRED EMBODIMENT

Figure 1A:
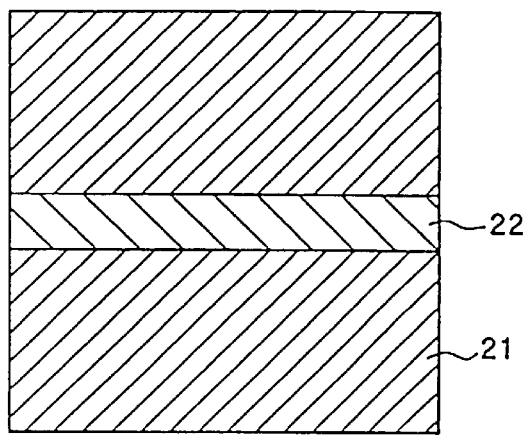
FIGS. 1A to 1D are cross-sectional views representing a conventional method of fabricating an SOI substrate described in Japanese Unexamined Patent Publication (Kokai) No. Hei 7-263538 in the process order.
Figure 1B:
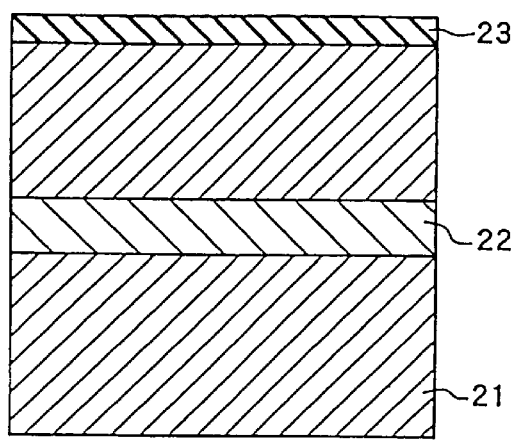
Figure 1C:
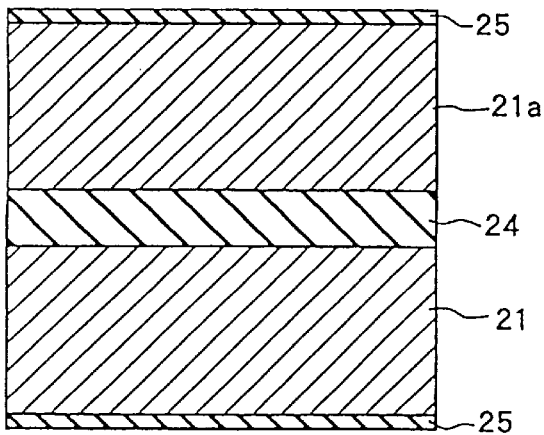
Figure 1D:
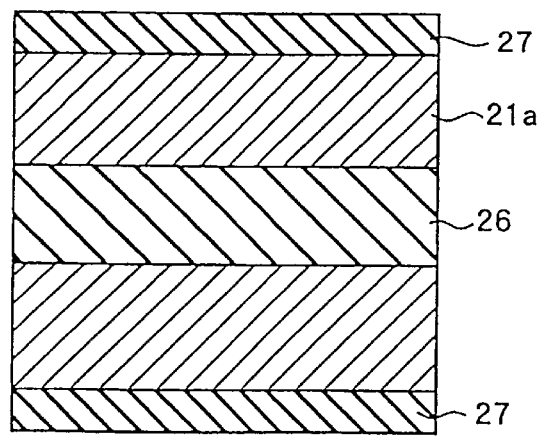

The embodiments of the present invention will be illustrated specifically.

If the dose of an oxygen ion is over $3 \times 10^{17}$ ($cm^{-2}$), excess crystal defects are generated in a surface silicon layer of an SOI substrate, therefore, the dose of an oxygen ion shall be $3 \times 10^{17}$ ($cm^{-2}$) or lower. Especially when the dose is $2 \times 10^{17}$ ($cm^{-2}$) or lower, effect to inhibit generation of a crystal defect increases. On the other hand, if the dose of an oxygen ion is less than $1 \times 10^{15}$ ($cm^{-2}$), an oxygen ion is not sufficient and formation of a continuous oxide film becomes difficult. Therefore, the dose of an oxygen ion is preferably from $1 \times 10^{15}$ to $2 \times 10^{17}$ ($cm^{-2}$). Further, the acceleration speed of the ion can be suitably selected depending on the depth of ion implantation.

When the treating temperature in low temperature thermal treatment after ion implantation is over 1250° C., a minute oxide island can not exist in stable manner. Therefore, the treating temperature in low temperature thermal treatment shall be 1250° C. or lower. When the treating temperature is lower than 300° C., a growth of a nucleus requires impractical long time, therefore, the treating temperature is preferably 300° C. or higher. The treating temperature is not required to be constant, and it may be raised from low temperature to given temperature.

In this low temperature thermal treatment, if the treating time is shorter than 40 minutes, the nucleus of an oxide island is not fully formed. Therefore, the treating time is 40 minutes or longer. The treating time is controlled in this range depending on the treating temperature.

The silicon substrate can be heated in an inert gas atmosphere such as a nitrogen gas, argon gas or the like, a mixed gas atmosphere of these inert gases and an oxygen gas, an oxygen atmosphere, or the like in the low temperature thermal treatment. In particular, if the silicon substrate is heated in an atmosphere containing an oxygen gas from 0.5 to 100% by volume, low temperature thermal treatment time is shortened. In the case of high treating temperature, if oxygen concentration is too high, the surface of a silicon substrate is oxidized and etched, therefore, it is preferable that the oxygen concentration is appropriately determined considering the treating temperature.

On the other hand, when the treating temperature in high temperature thermal treatment after low temperature thermal treatment is lower than 1300° C., the nucleus of an oxide island which is formed by the low temperature thermal treatment does not grow, and a continuous oxide film is not formed. Therefore, the treating temperature in the high temperature thermal treatment shall be 1300° C. or higher. In this case, the practical treating temperature shall be about 1400° C. or lower in consideration of the melting point of silicon.

The silicon substrate can be heated in an inert gas atmosphere such as a nitrogen gas, argon gas or the like, or a mixed gas atmosphere of these inert gases and an oxygen gas in the high temperature thermal treatment.

Further, in the present invention, the silicon substrate may also be heated in an atmosphere containing an oxygen gas in 1% by volume or more at 1300° C. or higher. By this process, the surface of the Si substrate is oxidized, and at the same time, the thickness of the continuous oxide film formed inside the substrate increases. In this case, in an area formed by combination of the oxide islands in the oxide film, a minute area wherein the Si content is high is selectively oxidized, and the quality of the buried oxide film is improved. In the present invention, since a lot of oxide islands join together in high temperature thermal treatment, the above-described thermal treatment after the high temperature thermal treatment, especially the treatment in an inert gas atmosphere, is extremely effective for obtaining an excellent SOI substrate. The silicon substrate may be heated in a thermal treatment independent of the high temperature thermal treatment, or may also be heated continuously by increasing the oxygen concentration following to the high temperature thermal treatment.

Figure 2A:
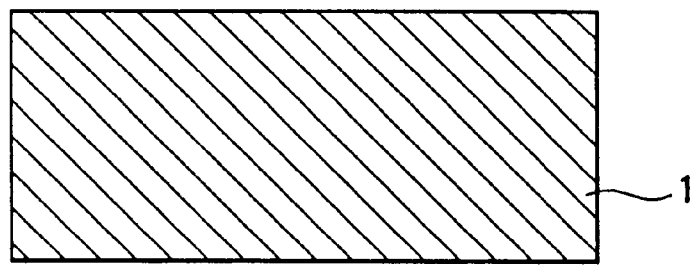
FIGS. 2A to 2C are cross-sectional views representing a method of fabricating an SOI substrate of the first example of the present invention in the process order.
Figure 2B:
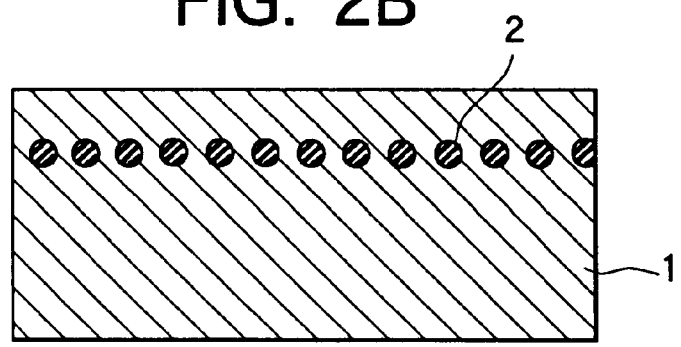
Figure 2C:
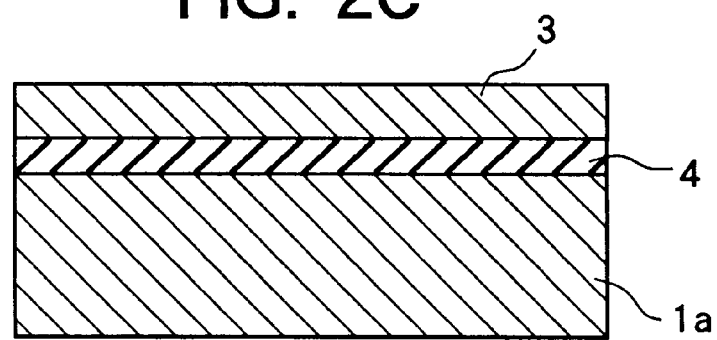

Examples of the present invention will be specifically explained comparing with a comparative example not within the scope of claims. FIGS. 2A to 2C are cross-sectional views representing a method of fabricating an SOI substrate of the first example of the present invention in the process order.

In the first example, there were prepared a plurality of 6-inch P-type Si substrates 1 having (100) surface, as shown in FIG. 2A. The resistance of the Si substrate is from 1 to 10 (Ω·cm).

Next, an oxygen ion was implanted into the P-type silicon substrate 1 with an acceleration energy of 180 keV and a dose of $2 \times 10^{17}$ ($cm^{-2}$). Then, each P-type silicon substrate 1 was heated in a low temperature thermal treatment at a temperature from 300 to 1250° C. for 1 to 10 hours such that one substrate 1 was treated at 300° C. for 10 hours and another substrate 1 was treated at 1250° C. for 1 hour in a $N_2$ gas atmosphere. By this process, as shown in FIG. 2B, on each substrate 1, nuclei 2 of oxide islands were deposited at high density.

Next, the silicon substrate was heated in a high temperature thermal treatment at a treating temperature of 1350° C. for 5 hours in an Ar gas atmosphere containing an oxygen gas in an amount of 0.5% by volume. Thus, SOI substrates were fabricated.

Thereafter, the structure of each substrate 1 was evaluated in detail by using a transmission electron microscope (TEM) or adopting an X-ray topography method. As a result, as shown in FIG. 2C, a continuous oxide film 4 was formed, and an active layer 3 and a Si substrate 1a are divided by the oxide film 4. The continuous oxide film 4 was formed by generation of nuclei 2 of oxide islands at high density by low temperature thermal treatment, and by mutual combination of oxide islands formed by concentration of oxygen atoms around the nuclei in the subsequent high temperature thermal treatment.

The density of crystal defects in the active layer 3 was 10 ($cm^{-2}$) or less, and it was extremely low as compared with a density from 100 to 1000 ($cm^{-2}$) in the case of oxygen ion implantation in large scale by the conventional methods.

Next, the second example will be explained, of which conditions for low temperature thermal treatment differ from those of the first example. In the low temperature thermal treatment of the second example, each substrate was subjected to thermal treatment for 40 minutes to 2 hours at 300 to 1250° C. in a mixed gas atmosphere of an Ar gas or $N_2$ gas with an $O_2$ gas in an amount over 0.5 lower than 100% by volume or an $O_2$ gas atmosphere of 100% by volume. And, SOI substrates were fabricated in the same manner as in the first example.

As a result of evaluation conducted in the same manner as in the first example, a continuous oxide film was formed in the SOI substrate. In the present example, the silicon substrate was heated in an atmosphere having high oxygen concentration in the low temperature thermal treatment, deposition of the nuclei of oxide islands were promoted, and even by low temperature thermal treatment of shorter period as compared with the first example, the same effect as that of the first example could be obtained.

The density of the crystal defects in the active layer was 10 ($cm^{-2}$) or less like the first example, and it was extremely low as compared with those in the conventional methods.

Next, the third example will be explained, of which conditions for low temperature thermal treatment differ from those of the first and second examples. In the low temperature thermal treatment of the third example, each substrate was subjected to thermal treatment at a temperature rising speed of 1 to 20 (° C./min) from room temperature to 1250° C. in a mixed gas atmosphere of an Ar gas or $N_2$ gas with an $O_2$ gas in an amount over 0.5 lower than 100% by volume or an $O_2$ gas atmosphere of 100% by volume. And, SOI substrates were manufactured in the same manner as in the first example.

As a result of evaluation conducted in the same manner as in the first example, a continuous oxide film was formed in the SOI substrate. In the present example, the silicon substrate was heated with raising temperature, deposition of the nuclei of oxide islands were more promoted, and even by thermal treatment of shorter period as compared with treatment with constant treating temperature, the same effect could be obtained.

The density of the crystal defects in the active layer was 10 ($cm^{-2}$) or less like the first example, and it was extremely low as compared with those in the conventional methods.

Next, the fourth example will be explained, in which each silicon substrate was further heated after the process of the first example, the second example or the third example. In the fourth example, each silicon substrate was heated for 30 minutes to 3 hours in an Ar gas or $N_2$ gas atmosphere containing an $O_2$ gas in an amount of 1% by volume or higher, for example, 5% by volume at a treating temperature of 1300° C. or more, for example, 1350° C.

As a result, more excellent SOI substrates could be obtained.

Figure 3A:
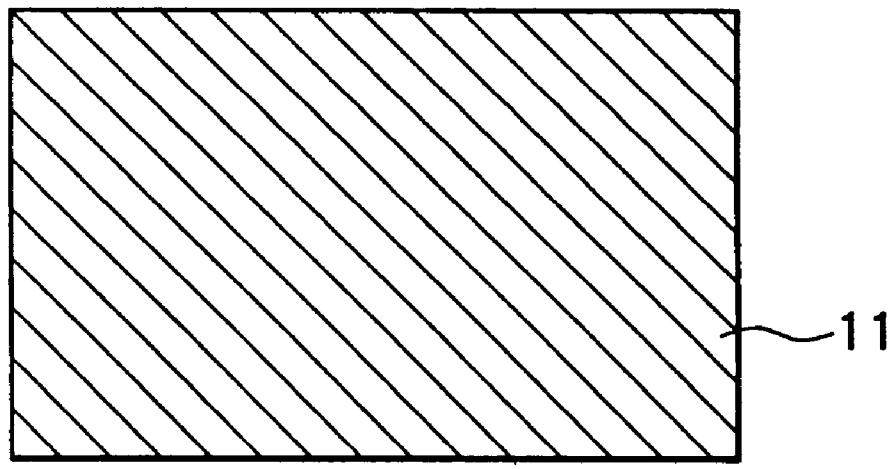
FIGS. 3A to 3B are cross-sectional views representing a method of fabricating an SOI substrate of a comparative example in the process order.
Figure 3B:
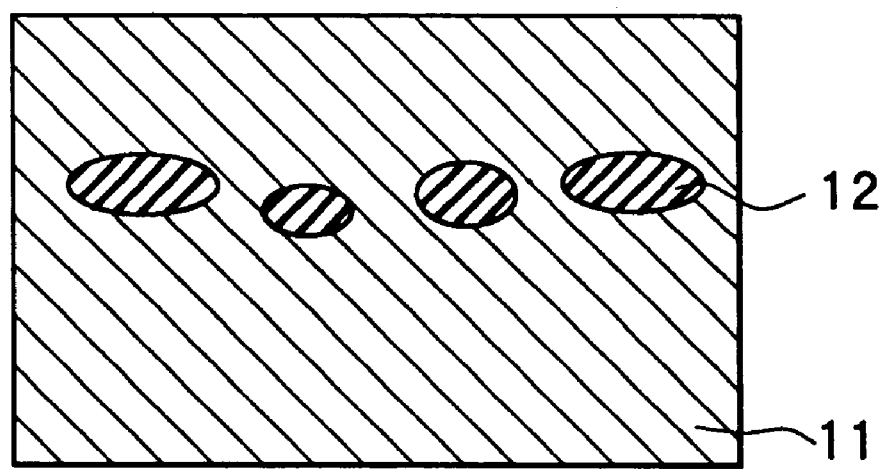

Next, a comparative example will be explained, in which the low temperature thermal treatment conducted for 1 to 10 hours at from 300 to 1250° C. carried out in the first example was deleted. FIGS. 3A to 3B are cross-sectional views representing a method of fabricating an SOI substrate of a comparative example in the process order.

In the comparative example, oxygen ion was implanted into a P-type Si substrate 11 shown in FIG. 3A, then, the silicon substrate 11 was heated in the high temperature thermal treatment. The conditions in these processes were the same as those in the first example.

Thus, as a result of evaluation conducted in the same manner as in the first example, as shown in FIG. 3B, only discontinuous oxide islands 12 were observed in the Si substrate 11, and no continuous oxide film was formed.

In the comparative example, since the Si substrate 11 was not heated before the high temperature thermal treatment, the density of oxide islands did not increase, and since the oxide island could not grow, there was no mutual integration.

The conditions for the ion implantation or thermal treatment in the above-described examples are only examples, and the present invention should not be limited to them. For example, even if a silicon substrate is heated in an Ar gas atmosphere containing an $O_2$ gas in an amount of 0.5% by volume in a low temperature thermal treatment like high temperature thermal treatment, the same effect can be obtained. In this case, since change of atmosphere gases between processes is not required, continuous treatment is possible in the same thermal treatment furnace.

What is claimed is:

1. A method of forming an SOI substrate, comprising:

creating a plurality of oxide islands beneath a surface of a silicon substrate;

heating the substrate at a relatively low temperature to promote growth of the oxide islands; and following heating the substrate at a relatively low temperature, heating the substrate at a relatively high temperature to cause the oxide islands to form a continuous layer.

2. A method, according to claim 1, wherein creating a plurality of oxide islands includes implanting oxygen ions into the substrate.

3. A method, according to claim 2, wherein implanting oxygen ions includes implanting oxygen ions at an energy of 180 keV and at a dose sufficient to result in a density of crystal defects at the surface of the substrate of less than or equal to 10 ($cm^2$).

4. A method, according to claim 2, wherein implanting oxygen ions includes implanting oxygen ions at a dose of less than or equal to $3 \times 10^{17}$ ($cm^2$).

5. A method, according to claim 4, wherein implanting oxygen ions includes implanting oxygen ions at a dose of between $1 \times 10^{15}$ ($cm^{-2}$) and $2 \times 10^{17}$ ($cm^{-2}$).

6. A method, according to claim 1, wherein heating the substrate at a relatively low temperature includes heating the substrate at 1250 degrees centigrade or less.

7. A method, according to claim 6, wherein heating the substrate at a relatively low temperature includes heating the substrate at 300 degrees centigrade or greater.

8. A method, according to claim 6, wherein heating the substrate at a relatively low temperature includes heating the substrate for forty minutes or greater.

9. A method, according to claim 6, wherein heating the substrate at a relatively low temperature includes increasing the temperature at a rate of between one and twenty degrees centigrade per minute.

10. A method, according to claim 6, wherein heating the substrate at a relatively low temperature includes heating the substrate for an amount of time that varies according to the temperature.

11. A method, according to claim 6, wherein heating the substrate at a relatively low temperature includes using a gas containing oxygen.

12. A method, according to claim 6, wherein heating the substrate at a relatively high temperature includes heating the substrate at 1300 degrees centigrade or higher.

13. A method, according to claim 12, wherein heating the substrate at a relatively high temperature includes heating the substrate at 1400 degrees centigrade or higher.

14. A method, according to claim 12, wherein heating the substrate at a relatively high temperature includes using a gas containing oxygen.

* * * * *